United States Patent
Kamran et al.

(10) Patent No.: US 11,755,244 B2
(45) Date of Patent: Sep. 12, 2023

(54) SYSTEM AND METHOD FOR SMART NVMEOF DISK ARRAY ENCLOSURE DEEP BACKGROUND DATA REDUCTION OFFLOAD

(71) Applicant: EMC IP Holding Company, LLC, Hopkinton, MA (US)

(72) Inventors: Lior Kamran, Rishon LeZion (IL); Amitai Alkalay, Kadima (IL)

(73) Assignee: EMC IP Holding Company, LLC, Hopkinton, MA (US)

( * ) Notice: Subject to any disclaimer, the term of this patent is extended or adjusted under 35 U.S.C. 154(b) by 0 days.

(21) Appl. No.: 17/237,971

(22) Filed: Apr. 22, 2021

(65) Prior Publication Data

US 2022/0342596 A1      Oct. 27, 2022

(51) Int. Cl.
   *G06F 3/06*      (2006.01)
   *H03M 7/30*      (2006.01)

(52) U.S. Cl.
   CPC .......... *G06F 3/0659* (2013.01); *G06F 3/0608* (2013.01); *G06F 3/0673* (2013.01); *H03M 7/6064* (2013.01)

(58) Field of Classification Search
   CPC .... G06F 3/0608; G06F 3/0673; G06F 3/0689; G06F 12/0253; G06F 2211/1014; G06F 2212/401
   See application file for complete search history.

(56) References Cited

U.S. PATENT DOCUMENTS

| | | | | |
|---|---|---|---|---|
| 2011/0271070 | A1* | 11/2011 | Worthington | G06F 3/0688 711/E12.001 |
| 2013/0179410 | A1* | 7/2013 | Amit | G06F 3/064 707/693 |
| 2014/0195498 | A1* | 7/2014 | Asher | H03M 7/6088 707/693 |
| 2016/0188212 | A1* | 6/2016 | Camp | G06F 12/0246 711/171 |
| 2018/0307598 | A1* | 10/2018 | Fischer | G06F 3/0643 |
| 2021/0405882 | A1* | 12/2021 | Venkatasubbaiah | G06F 16/285 |

\* cited by examiner

*Primary Examiner* — Tracy A Warren
(74) *Attorney, Agent, or Firm* — Brian J. Colandreo; Heath M. Sargeant; Holland & Knight LLP

(57) ABSTRACT

A method, computer program product, and computer system for identifying, by a computing device, storage containers that contain cold data. At least a portion of the storage containers may be processed to determine whether a first compression technique will result in a higher level of compression above a threshold level of compression than a second compression technique. The storage containers may be processed using the first compression technique based upon, at least in part, determining that the first compression technique will result in the higher level of compression above the threshold level of compression than the second compression technique.

20 Claims, 7 Drawing Sheets

SYSTEM AND METHOD FOR SMART NVMEOF DISK ARRAY ENCLOSURE DEEP BACKGROUND DATA REDUCTION OFFLOAD

BACKGROUND

Some storage systems may be composed of storage nodes that generally consist of CPUs, Memories and a DAE (Disk Array Enclosure) as the backend. The system may support capacity expansion by connection a Smart NVMe over Fabric (NVMeOF) expansion DAE. The Smart DAE may be connected to the storage Nodes through an Ethernet interface and may expose the drives and may include memory and compute resources. The storage system may use a fixed-size page granularity, where each fixed size page may be compressed disparately and stored on parity protected stripes.

BRIEF SUMMARY OF DISCLOSURE

In one example implementation, a method, performed by one or more computing devices, may include but is not limited to identifying, by a computing device, storage containers that contain cold data. At least a portion of the storage containers may be processed to determine whether a first compression technique will result in a higher level of compression above a threshold level of compression than a second compression technique. The storage containers may be processed using the first compression technique based upon, at least in part, determining that the first compression technique will result in the higher level of compression above the threshold level of compression than the second compression technique.

One or more of the following example features may be included. A list of storage containers and bitmap pairs to process may be maintained. At least a second portion of the storage containers already compressed with the first compression technique may be skipped. A command may be received for each portion of the storage containers to be processed. The command may include a location of a physical large block of the storage container, the first compression technique to be used, a location to write a new physical large block with the first compression technique. Metadata on a virtual logical block associated with the location may be updated. The metadata that is updated may include the location of each data block within the physical large block.

In another example implementation, a computing system may include one or more processors and one or more memories configured to perform operations that may include but are not limited to identifying, by a computing device, storage containers that contain cold data. At least a portion of the storage containers may be processed to determine whether a first compression technique will result in a higher level of compression above a threshold level of compression than a second compression technique. The storage containers may be processed using the first compression technique based upon, at least in part, determining that the first compression technique will result in the higher level of compression above the threshold level of compression than the second compression technique.

One or more of the following example features may be included. A list of storage containers and bitmap pairs to process may be maintained. At least a second portion of the storage containers already compressed with the first compression technique may be skipped. A command may be received for each portion of the storage containers to be processed. The command may include a location of a physical large block of the storage container, the first compression technique to be used, a location to write a new physical large block with the first compression technique. Metadata on a virtual logical block associated with the location may be updated. The metadata that is updated may include the location of each data block within the physical large block.

In another example implementation, a computer program product may reside on a computer readable storage medium having a plurality of instructions stored thereon which, when executed across one or more processors, may cause at least a portion of the one or more processors to perform operations that may include but are not limited to identifying, by a computing device, storage containers that contain cold data. At least a portion of the storage containers may be processed to determine whether a first compression technique will result in a higher level of compression above a threshold level of compression than a second compression technique. The storage containers may be processed using the first compression technique based upon, at least in part, determining that the first compression technique will result in the higher level of compression above the threshold level of compression than the second compression technique.

One or more of the following example features may be included. A list of storage containers and bitmap pairs to process may be maintained. At least a second portion of the storage containers already compressed with the first compression technique may be skipped. A command may be received for each portion of the storage containers to be processed. The command may include a location of a physical large block of the storage container, the first compression technique to be used, a location to write a new physical large block with the first compression technique. Metadata on a virtual logical block associated with the location may be updated. The metadata that is updated may include the location of each data block within the physical large block.

The details of one or more example implementations are set forth in the accompanying drawings and the description below. Other possible example features and/or possible example advantages will become apparent from the description, the drawings, and the claims. Some implementations may not have those possible example features and/or possible example advantages, and such possible example features and/or possible example advantages may not necessarily be required of some implementations.

BRIEF DESCRIPTION OF THE DRAWINGS

Like reference symbols in the various drawings indicate like elements.

DETAILED DESCRIPTION

Figure 1:
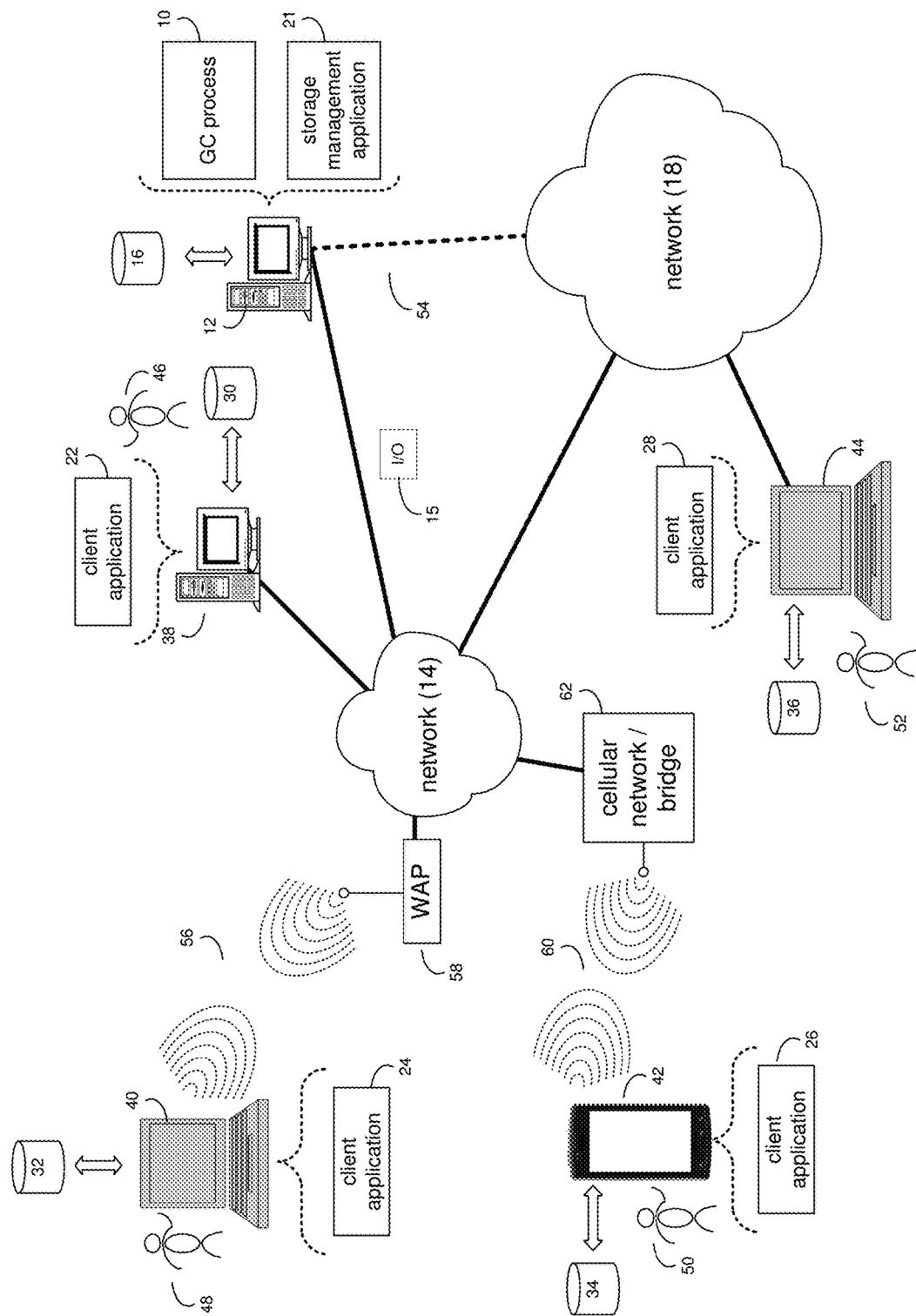
FIG. 1 is an example diagrammatic view of a GC process coupled to an example distributed computing network according to one or more example implementations of the disclosure.

System Overview:

In some implementations, the present disclosure may be embodied as a method, system, or computer program product. Accordingly, in some implementations, the present disclosure may take the form of an entirely hardware implementation, an entirely software implementation (including firmware, resident software, micro-code, etc.) or an implementation combining software and hardware aspects that may all generally be referred to herein as a "circuit," "module" or "system." Furthermore, in some implementations, the present disclosure may take the form of a computer program product on a computer-usable storage medium having computer-usable program code embodied in the medium.

In some implementations, any suitable computer usable or computer readable medium (or media) may be utilized. The computer readable medium may be a computer readable signal medium or a computer readable storage medium. The computer-usable, or computer-readable, storage medium (including a storage device associated with a computing device or client electronic device) may be, for example, but is not limited to, an electronic, magnetic, optical, electromagnetic, infrared, or semiconductor system, apparatus, device, or any suitable combination of the foregoing. More specific examples (a non-exhaustive list) of the computer-readable medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a digital versatile disk (DVD), a static random access memory (SRAM), a memory stick, a floppy disk, a mechanically encoded device such as punch-cards or raised structures in a groove having instructions recorded thereon, a media such as those supporting the internet or an intranet, or a magnetic storage device. Note that the computer-usable or computer-readable medium could even be a suitable medium upon which the program is stored, scanned, compiled, interpreted, or otherwise processed in a suitable manner, if necessary, and then stored in a computer memory. In the context of the present disclosure, a computer-usable or computer-readable, storage medium may be any tangible medium that can contain or store a program for use by or in connection with the instruction execution system, apparatus, or device.

In some implementations, a computer readable signal medium may include a propagated data signal with computer readable program code embodied therein, for example, in baseband or as part of a carrier wave. In some implementations, such a propagated signal may take any of a variety of forms, including, but not limited to, electromagnetic, optical, or any suitable combination thereof. In some implementations, the computer readable program code may be transmitted using any appropriate medium, including but not limited to the internet, wireline, optical fiber cable, RF, etc. In some implementations, a computer readable signal medium may be any computer readable medium that is not a computer readable storage medium and that can communicate, propagate, or transport a program for use by or in connection with an instruction execution system, apparatus, or device.

In some implementations, computer program code for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java®, Smalltalk, C++ or the like. Java® and all Java-based trademarks and logos are trademarks or registered trademarks of Oracle and/or its affiliates. However, the computer program code for carrying out operations of the present disclosure may also be written in conventional procedural programming languages, such as the "C" programming language, PASCAL, or similar programming languages, as well as in scripting languages such as Javascript, PERL, or Python. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the internet using an Internet Service Provider). In some implementations, electronic circuitry including, for example, programmable logic circuitry, field-programmable gate arrays (FPGAs) or other hardware accelerators, micro-controller units (MCUs), or programmable logic arrays (PLAs) may execute the computer readable program instructions/code by utilizing state information of the computer readable program instructions to personalize the electronic circuitry, in order to perform aspects of the present disclosure.

In some implementations, the flowchart and block diagrams in the figures illustrate the architecture, functionality, and operation of possible implementations of apparatus (systems), methods and computer program products according to various implementations of the present disclosure. Each block in the flowchart and/or block diagrams, and combinations of blocks in the flowchart and/or block diagrams, may represent a module, segment, or portion of code, which comprises one or more executable computer program instructions for implementing the specified logical function(s)/act(s). These computer program instructions may be provided to a processor of a general purpose computer, special purpose computer, or other programmable data processing apparatus to produce a machine, such that the computer program instructions, which may execute via the processor of the computer or other programmable data processing apparatus, create the ability to implement one or more of the functions/acts specified in the flowchart and/or block diagram block or blocks or combinations thereof. It should be noted that, in some implementations, the functions noted in the block(s) may occur out of the order noted in the figures (or combined or omitted). For example, two blocks shown in succession may, in fact, be executed substantially concurrently, or the blocks may sometimes be executed in the reverse order, depending upon the functionality involved.

In some implementations, these computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks or combinations thereof.

In some implementations, the computer program instructions may also be loaded onto a computer or other programmable data processing apparatus to cause a series of operational steps to be performed (not necessarily in a particular order) on the computer or other programmable apparatus to produce a computer implemented process such that the instructions which execute on the computer or other programmable apparatus provide steps for implementing the functions/acts (not necessarily in a particular order) specified in the flowchart and/or block diagram block or blocks or combinations thereof.

Referring now to the example implementation of FIG. 1, there is shown GC process 10 that may reside on and may be executed by a computer (e.g., computer 12), which may be connected to a network (e.g., network 14) (e.g., the internet or a local area network). Examples of computer 12 (and/or one or more of the client electronic devices noted below) may include, but are not limited to, a storage system (e.g., a Network Attached Storage (NAS) system, a Storage Area Network (SAN)), a personal computer(s), a laptop computer(s), mobile computing device(s), a server computer, a series of server computers, a mainframe computer (s), or a computing cloud(s). As is known in the art, a SAN may include one or more of the client electronic devices, including a RAID device and a NAS system. In some implementations, each of the aforementioned may be generally described as a computing device. In certain implementations, a computing device may be a physical or virtual device. In many implementations, a computing device may be any device capable of performing operations, such as a dedicated processor, a portion of a processor, a virtual processor, a portion of a virtual processor, portion of a virtual device, or a virtual device. In some implementations, a processor may be a physical processor or a virtual processor. In some implementations, a virtual processor may correspond to one or more parts of one or more physical processors. In some implementations, the instructions/logic may be distributed and executed across one or more processors, virtual or physical, to execute the instructions/logic. Computer 12 may execute an operating system, for example, but not limited to, Microsoft® Windows®; Mac® OS X®; Red Hat® Linux®, Windows® Mobile, Chrome OS, Blackberry OS, Fire OS, or a custom operating system. (Microsoft and Windows are registered trademarks of Microsoft Corporation in the United States, other countries or both; Mac and OS X are registered trademarks of Apple Inc. in the United States, other countries or both; Red Hat is a registered trademark of Red Hat Corporation in the United States, other countries or both; and Linux is a registered trademark of Linus Torvalds in the United States, other countries or both).

In some implementations, as will be discussed below in greater detail, a Garbage Collection (GC) process, such as GC process 10 of FIG. 1, may identify, by a computing device, storage containers that contain cold data. At least a portion of the storage containers may be processed to determine whether a first compression technique will result in a higher level of compression above a threshold level of compression than a second compression technique. The storage containers may be processed using the first compression technique based upon, at least in part, determining that the first compression technique will result in the higher level of compression above the threshold level of compression than the second compression technique.

In some implementations, the instruction sets and subroutines of GC process 10, which may be stored on storage device, such as storage device 16, coupled to computer 12, may be executed by one or more processors and one or more memory architectures included within computer 12. In some implementations, storage device 16 may include but is not limited to: a hard disk drive; all forms of flash memory storage devices; a tape drive; an optical drive; a RAID array (or other array); a random access memory (RAM); a read-only memory (ROM); or combination thereof. In some implementations, storage device 16 may be organized as an extent, an extent pool, a RAID extent (e.g., an example 4D+1P R5, where the RAID extent may include, e.g., five storage device extents that may be allocated from, e.g., five different storage devices), a mapped RAID (e.g., a collection of RAID extents), or combination thereof.

In some implementations, network 14 may be connected to one or more secondary networks (e.g., network 18), examples of which may include but are not limited to: a local area network; a wide area network or other telecommunications network facility; or an intranet, for example. The phrase "telecommunications network facility," as used herein, may refer to a facility configured to transmit, and/or receive transmissions to/from one or more mobile client electronic devices (e.g., cellphones, etc.) as well as many others.

In some implementations, computer 12 may include a data store, such as a database (e.g., relational database, object-oriented database, triplestore database, etc.) and may be located within any suitable memory location, such as storage device 16 coupled to computer 12. In some implementations, data, metadata, information, etc. described throughout the present disclosure may be stored in the data store. In some implementations, computer 12 may utilize any known database management system such as, but not limited to, DB2, in order to provide multi-user access to one or more databases, such as the above noted relational database. In some implementations, the data store may also be a custom database, such as, for example, a flat file database or an XML database. In some implementations, any other form(s) of a data storage structure and/or organization may also be used. In some implementations, GC process 10 may be a component of the data store, a standalone application that interfaces with the above noted data store and/or an applet/application that is accessed via client applications 22, 24, 26, 28. In some implementations, the above noted data store may be, in whole or in part, distributed in a cloud computing topology. In this way, computer 12 and storage device 16 may refer to multiple devices, which may also be distributed throughout the network.

In some implementations, computer 12 may execute a storage management application (e.g., storage management application 21), examples of which may include, but are not limited to, e.g., a storage system application, a cloud computing application, a data synchronization application, a data migration application, a garbage collection application, or other application that allows for the implementation and/or management of data in a clustered (or non-clustered) environment (or the like). In some implementations, GC process 10 and/or storage management application 21 may be accessed via one or more of client applications 22, 24, 26, 28. In some implementations, GC process 10 may be a standalone application, or may be an applet/application/ script/extension that may interact with and/or be executed within storage management application 21, a component of storage management application 21, and/or one or more of client applications 22, 24, 26, 28. In some implementations, storage management application 21 may be a standalone application, or may be an applet/application/script/extension that may interact with and/or be executed within GC process 10, a component of GC process 10, and/or one or more of client applications 22, 24, 26, 28. In some implementations, one or more of client applications 22, 24, 26, 28 may be a standalone application, or may be an applet/application/script/extension that may interact with and/or be executed within and/or be a component of GC process 10 and/or storage management application 21. Examples of client applications 22, 24, 26, 28 may include, but are not limited to, e.g., a storage system application, a cloud computing application, a data synchronization application, a data migration application, a garbage collection application, or other application that allows for the implementation and/or management of data in a clustered (or non-clustered) environment (or the like), a standard and/or mobile web browser, an email application (e.g., an email client application), a textual and/or a graphical user interface, a customized web browser, a plugin, an Application Programming Interface (API), or a custom application. The instruction sets and subroutines of client applications 22, 24, 26, 28, which may be stored on storage devices 30, 32, 34, 36, coupled to client electronic devices 38, 40, 42, 44, may be executed by one or more processors and one or more memory architectures incorporated into client electronic devices 38, 40, 42, 44.

In some implementations, one or more of storage devices 30, 32, 34, 36, may include but are not limited to: hard disk drives; flash drives, tape drives; optical drives; RAID arrays; random access memories (RAM); and read-only memories (ROM). Examples of client electronic devices 38, 40, 42, 44 (and/or computer 12) may include, but are not limited to, a personal computer (e.g., client electronic device 38), a laptop computer (e.g., client electronic device 40), a smart/data-enabled, cellular phone (e.g., client electronic device 42), a notebook computer (e.g., client electronic device 44), a tablet, a server, a television, a smart television, a smart speaker, an Internet of Things (IoT) device, a media (e.g., video, photo, etc.) capturing device, and a dedicated network device. Client electronic devices 38, 40, 42, 44 may each execute an operating system, examples of which may include but are not limited to, Android™, Apple® iOS®, Mac® OS X®; Red Hat® Linux®, Windows® Mobile, Chrome OS, Blackberry OS, Fire OS, or a custom operating system.

In some implementations, one or more of client applications 22, 24, 26, 28 may be configured to effectuate some or all of the functionality of GC process 10 (and vice versa). Accordingly, in some implementations, GC process 10 may be a purely server-side application, a purely client-side application, or a hybrid server-side/client-side application that is cooperatively executed by one or more of client applications 22, 24, 26, 28 and/or GC process 10.

In some implementations, one or more of client applications 22, 24, 26, 28 may be configured to effectuate some or all of the functionality of storage management application 21 (and vice versa). Accordingly, in some implementations, storage management application 21 may be a purely server-side application, a purely client-side application, or a hybrid server-side/client-side application that is cooperatively executed by one or more of client applications 22, 24, 26, 28 and/or storage management application 21. As one or more of client applications 22, 24, 26, 28, GC process 10, and storage management application 21, taken singly or in any combination, may effectuate some or all of the same functionality, any description of effectuating such functionality via one or more of client applications 22, 24, 26, 28, GC process 10, storage management application 21, or combination thereof, and any described interaction(s) between one or more of client applications 22, 24, 26, 28, GC process 10, storage management application 21, or combination thereof to effectuate such functionality, should be taken as an example only and not to limit the scope of the disclosure.

In some implementations, one or more of users 46, 48, 50, 52 may access computer 12 and GC process 10 (e.g., using one or more of client electronic devices 38, 40, 42, 44) directly through network 14 or through secondary network 18. Further, computer 12 may be connected to network 14 through secondary network 18, as illustrated with phantom link line 54. GC process 10 may include one or more user interfaces, such as browsers and textual or graphical user interfaces, through which users 46, 48, 50, 52 may access GC process 10.

In some implementations, the various client electronic devices may be directly or indirectly coupled to network 14 (or network 18). For example, client electronic device 38 is shown directly coupled to network 14 via a hardwired network connection. Further, client electronic device 44 is shown directly coupled to network 18 via a hardwired network connection. Client electronic device 40 is shown wirelessly coupled to network 14 via wireless communication channel 56 established between client electronic device 40 and wireless access point (i.e., WAP) 58, which is shown directly coupled to network 14. WAP 58 may be, for example, an IEEE 802.11a, 802.11b, 802.11g, 802.11n, 802.11ac, Wi-Fi®, RFID, and/or Bluetooth™ (including Bluetooth™ Low Energy) device that is capable of establishing wireless communication channel 56 between client electronic device 40 and WAP 58. Client electronic device 42 is shown wirelessly coupled to network 14 via wireless communication channel 60 established between client electronic device 42 and cellular network/bridge 62, which is shown by example directly coupled to network 14.

In some implementations, some or all of the IEEE 802.11x specifications may use Ethernet protocol and carrier sense multiple access with collision avoidance (i.e., CSMA/CA) for path sharing. The various 802.11x specifications may use phase-shift keying (i.e., PSK) modulation or complementary code keying (i.e., CCK) modulation, for example. Bluetooth™ (including Bluetooth™ Low Energy) is a telecommunications industry specification that allows, e.g., mobile phones, computers, smart phones, and other electronic devices to be interconnected using a short-range wireless connection. Other forms of interconnection (e.g., Near Field Communication (NFC)) may also be used.

In some implementations, various I/O requests (e.g., I/O request 15) may be sent from, e.g., client applications 22, 24, 26, 28 to, e.g., computer 12. Examples of I/O request 15 may include but are not limited to, data write requests (e.g., a request that content be written to computer 12) and data read requests (e.g., a request that content be read from computer 12).

Figure 2:
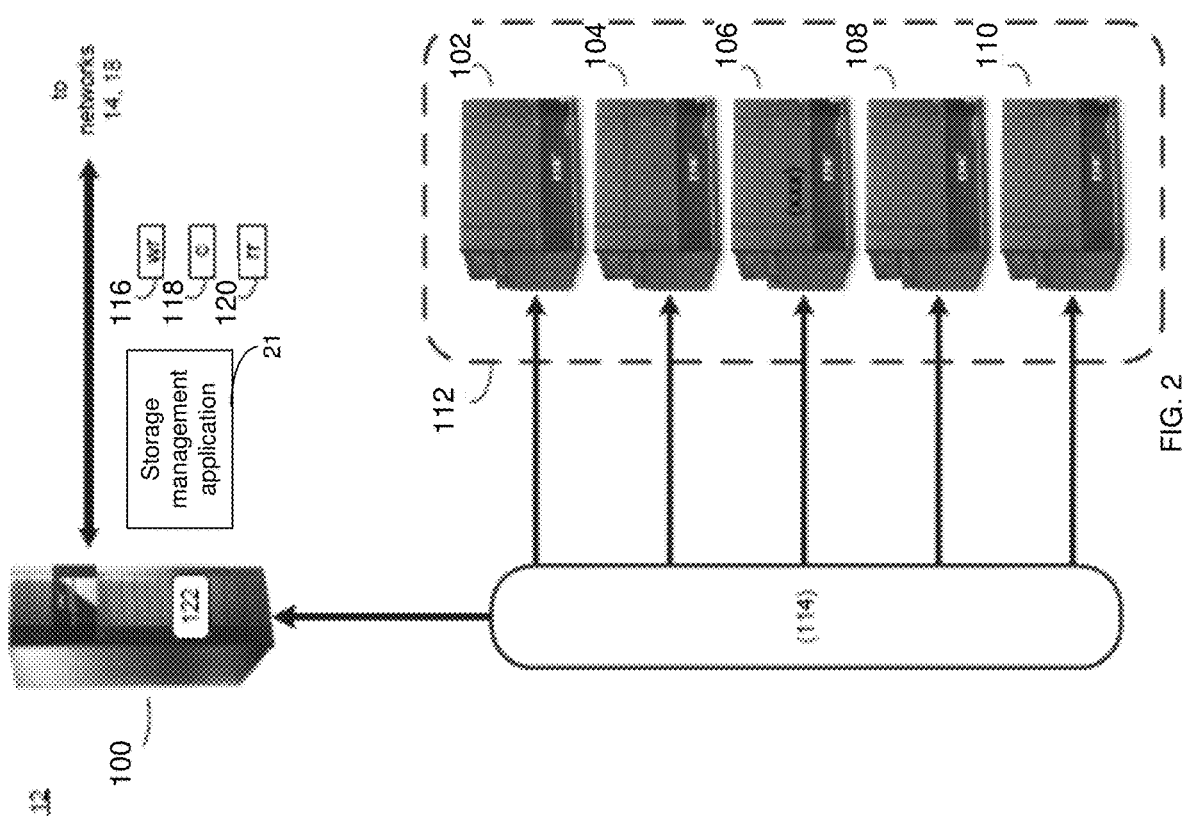
FIG. 2 is an example diagrammatic view of a storage system of FIG. 1 according to one or more example implementations of the disclosure.
Figure 3:
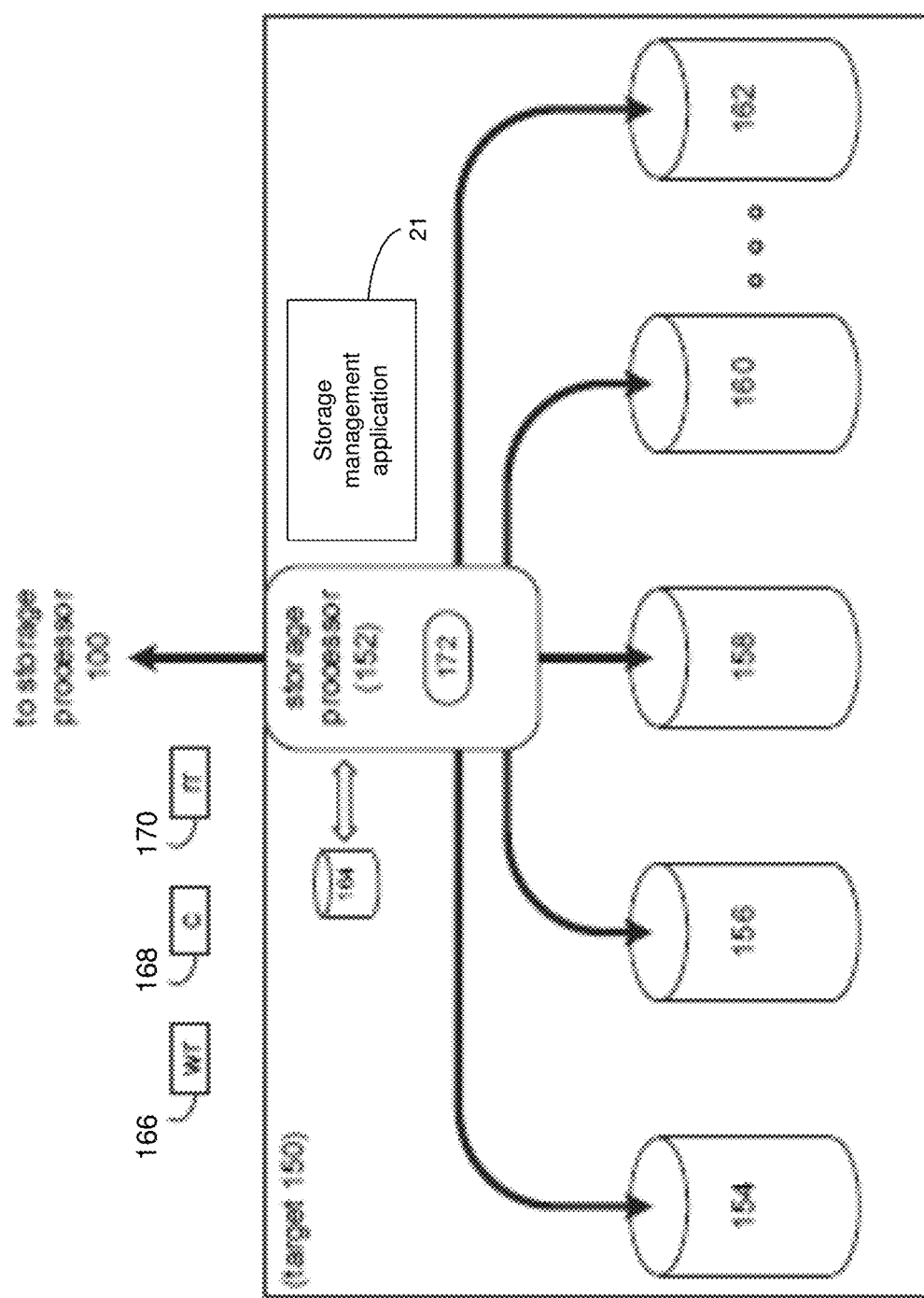
FIG. 3 is an example diagrammatic view of a storage target of FIG. 1 according to one or more example implementations of the disclosure.

Data Storage System:

Referring also to the example implementation of FIGS. 2-3 (e.g., where computer 12 may be configured as a data storage system), computer 12 may include storage processor 100 and a plurality of storage targets (e.g., storage targets 102, 104, 106, 108, 110). In some implementations, storage targets 102, 104, 106, 108, 110 may include any of the above-noted storage devices. In some implementations, storage targets 102, 104, 106, 108, 110 may be configured to provide various levels of performance and/or high availability. For example, storage targets 102, 104, 106, 108, 110 may be configured to form a non-fully-duplicative fault-tolerant data storage system (such as a non-fully-duplicative RAID data storage system), examples of which may include but are not limited to: RAID 3 arrays, RAID 4 arrays, RAID 5 arrays, and/or RAID 6 arrays. It will be appreciated that various other types of RAID arrays may be used without departing from the scope of the present disclosure.

While in this particular example, computer 12 is shown to include five storage targets (e.g., storage targets 102, 104, 106, 108, 110), this is for example purposes only and is not intended limit the present disclosure. For instance, the actual number of storage targets may be increased or decreased depending upon, e.g., the level of redundancy/performance/capacity required.

Further, the storage targets (e.g., storage targets 102, 104, 106, 108, 110) included with computer 12 may be configured to form a plurality of discrete storage arrays. For instance, and assuming for example purposes only that computer 12 includes, e.g., ten discrete storage targets, a first five targets (of the ten storage targets) may be configured to form a first RAID array and a second five targets (of the ten storage targets) may be configured to form a second RAID array.

In some implementations, one or more of storage targets 102, 104, 106, 108, 110 may be configured to store coded data (e.g., via storage management process 21), wherein such coded data may allow for the regeneration of data lost/corrupted on one or more of storage targets 102, 104, 106, 108, 110. Examples of such coded data may include but is not limited to parity data and Reed-Solomon data. Such coded data may be distributed across all of storage targets 102, 104, 106, 108, 110 or may be stored within a specific storage target.

Examples of storage targets 102, 104, 106, 108, 110 may include one or more data arrays, wherein a combination of storage targets 102, 104, 106, 108, 110 (and any processing/control systems associated with storage management application 21) may form data array 112.

The manner in which computer 12 is implemented may vary depending upon e.g., the level of redundancy/performance/capacity required. For example, computer 12 may be configured as a SAN (i.e., a Storage Area Network), in which storage processor 100 may be, e.g., a dedicated computing system and each of storage targets 102, 104, 106, 108, 110 may be a RAID device. An example of storage processor 100 may include but is not limited to a VPLEX™, VNX™, TRIDENT™, or Unity™ system offered by Dell EMC™ of Hopkinton, Mass.

In the example where computer 12 is configured as a SAN, the various components of computer 12 (e.g., storage processor 100, and storage targets 102, 104, 106, 108, 110) may be coupled using network infrastructure 114, examples of which may include but are not limited to an Ethernet (e.g., Layer 2 or Layer 3) network, a fiber channel network, an InfiniBand network, or any other circuit switched/packet switched network.

As discussed above, various I/O requests (e.g., I/O request 15) may be generated. For example, these I/O requests may be sent from, e.g., client applications 22, 24, 26, 28 to, e.g., computer 12. Additionally/alternatively (e.g., when storage processor 100 is configured as an application server or otherwise), these I/O requests may be internally generated within storage processor 100 (e.g., via storage management process 21). Examples of I/O request 15 may include but are not limited to data write request 116 (e.g., a request that content 118 be written to computer 12) and data read request 120 (e.g., a request that content 118 be read from computer 12).

In some implementations, during operation of storage processor 100, content 118 to be written to computer 12 may be received and/or processed by storage processor 100 (e.g., via storage management process 21). Additionally/alternatively (e.g., when storage processor 100 is configured as an application server or otherwise), content 118 to be written to computer 12 may be internally generated by storage processor 100 (e.g., via storage management process 21).

As discussed above, the instruction sets and subroutines of storage management application 21, which may be stored on storage device 16 included within computer 12, may be executed by one or more processors and one or more memory architectures included with computer 12. Accordingly, in addition to being executed on storage processor 100, some or all of the instruction sets and subroutines of storage management application 21 (and/or GC process 10) may be executed by one or more processors and one or more memory architectures included with data array 112.

In some implementations, storage processor 100 may include front end cache memory system 122. Examples of front end cache memory system 122 may include but are not limited to a volatile, solid-state, cache memory system (e.g., a dynamic RAM cache memory system), a non-volatile, solid-state, cache memory system (e.g., a flash-based, cache memory system), and/or any of the above-noted storage devices.

In some implementations, storage processor 100 may initially store content 118 within front end cache memory system 122. Depending upon the manner in which front end cache memory system 122 is configured, storage processor 100 (e.g., via storage management process 21) may immediately write content 118 to data array 112 (e.g., if front end cache memory system 122 is configured as a write-through cache) or may subsequently write content 118 to data array 112 (e.g., if front end cache memory system 122 is configured as a write-back cache).

In some implementations, one or more of storage targets 102, 104, 106, 108, 110 may include a backend cache memory system. Examples of the backend cache memory system may include but are not limited to a volatile, solid-state, cache memory system (e.g., a dynamic RAM cache memory system), a non-volatile, solid-state, cache memory system (e.g., a flash-based, cache memory system), and/or any of the above-noted storage devices.

Storage Targets:

As discussed above, one or more of storage targets 102, 104, 106, 108, 110 may be a RAID device. For instance, and referring also to FIG. 3, there is shown example target 150, wherein target 150 may be one example implementation of a RAID implementation of, e.g., storage target 102, storage target 104, storage target 106, storage target 108, and/or storage target 110. An example of target 150 may include but is not limited to a VPLEX™, VNX™, TRIDENT™, or Unity™ system offered by Dell EMC™ of Hopkinton, Mass. Examples of storage devices 154, 156, 158, 160, 162 may include one or more electro-mechanical hard disk drives, one or more solid-state/flash devices, and/or any of the above-noted storage devices. It will be appreciated that while the term "disk" or "drive" may be used throughout, these may refer to and be used interchangeably with any types of appropriate storage devices as the context and functionality of the storage device permits.

In some implementations, target 150 may include storage processor 152 and a plurality of storage devices (e.g., storage devices 154, 156, 158, 160, 162). Storage devices 154, 156, 158, 160, 162 may be configured to provide various levels of performance and/or high availability (e.g., via storage management process 21). For example, one or more of storage devices 154, 156, 158, 160, 162 (or any of the above-noted storage devices) may be configured as a RAID 0 array, in which data is striped across storage devices. By striping data across a plurality of storage devices, improved performance may be realized. However, RAID 0 arrays may not provide a level of high availability. Accordingly, one or more of storage devices 154, 156, 158, 160, 162 (or any of the above-noted storage devices) may be configured as a RAID 1 array, in which data is mirrored between storage devices. By mirroring data between storage devices, a level of high availability may be achieved as multiple copies of the data may be stored within storage devices 154, 156, 158, 160, 162.

While storage devices 154, 156, 158, 160, 162 are discussed above as being configured in a RAID 0 or RAID 1 array, this is for example purposes only and not intended to limit the present disclosure, as other configurations are possible. For example, storage devices 154, 156, 158, 160, 162 may be configured as a RAID 3, RAID 4, RAID 5 or RAID 6 array.

While in this particular example, target 150 is shown to include five storage devices (e.g., storage devices 154, 156, 158, 160, 162), this is for example purposes only and not intended to limit the present disclosure. For instance, the actual number of storage devices may be increased or decreased depending upon, e.g., the level of redundancy/performance/capacity required.

In some implementations, one or more of storage devices 154, 156, 158, 160, 162 may be configured to store (e.g., via storage management process 21) coded data, wherein such coded data may allow for the regeneration of data lost/corrupted on one or more of storage devices 154, 156, 158, 160, 162. Examples of such coded data may include but are not limited to parity data and Reed-Solomon data. Such coded data may be distributed across all of storage devices 154, 156, 158, 160, 162 or may be stored within a specific storage device.

The manner in which target 150 is implemented may vary depending upon e.g., the level of redundancy/performance/capacity required. For example, target 150 may be a RAID device in which storage processor 152 is a RAID controller card and storage devices 154, 156, 158, 160, 162 are individual "hot-swappable" hard disk drives. Another example of target 150 may be a RAID system, examples of which may include but are not limited to an NAS (i.e., Network Attached Storage) device or a SAN (i.e., Storage Area Network).

In some implementations, storage target 150 may execute all or a portion of storage management application 21. The instruction sets and subroutines of storage management application 21, which may be stored on a storage device (e.g., storage device 164) coupled to storage processor 152, may be executed by one or more processors and one or more memory architectures included with storage processor 152. Storage device 164 may include but is not limited to any of the above-noted storage devices.

As discussed above, computer 12 may be configured as a SAN, wherein storage processor 100 may be a dedicated computing system and each of storage targets 102, 104, 106, 108, 110 may be a RAID device. Accordingly, when storage processor 100 processes data requests 116, 120, storage processor 100 (e.g., via storage management process 21) may provide the appropriate requests/content (e.g., write request 166, content 168 and read request 170) to, e.g., storage target 150 (which is representative of storage targets 102, 104, 106, 108 and/or 110).

In some implementations, during operation of storage processor 152, content 168 to be written to target 150 may be processed by storage processor 152 (e.g., via storage management process 21). Storage processor 152 may include cache memory system 172. Examples of cache memory system 172 may include but are not limited to a volatile, solid-state, cache memory system (e.g., a dynamic RAM cache memory system) and/or a non-volatile, solid-state, cache memory system (e.g., a flash-based, cache memory system). During operation of storage processor 152, content 168 to be written to target 150 may be received by storage processor 152 (e.g., via storage management process 21) and initially stored (e.g., via storage management process 21) within front end cache memory system 172.

Figure 4:
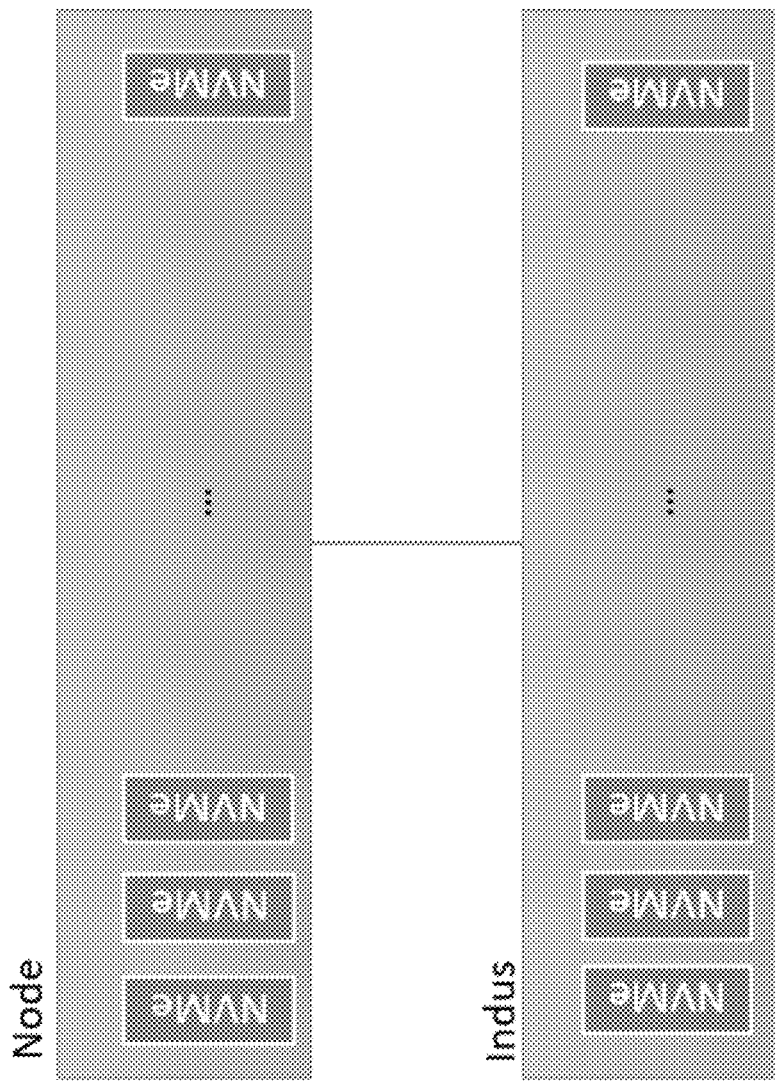
FIG. 4 is an example diagrammatic view of a system architecture according to one or more example implementations of the disclosure.
Figure 5:
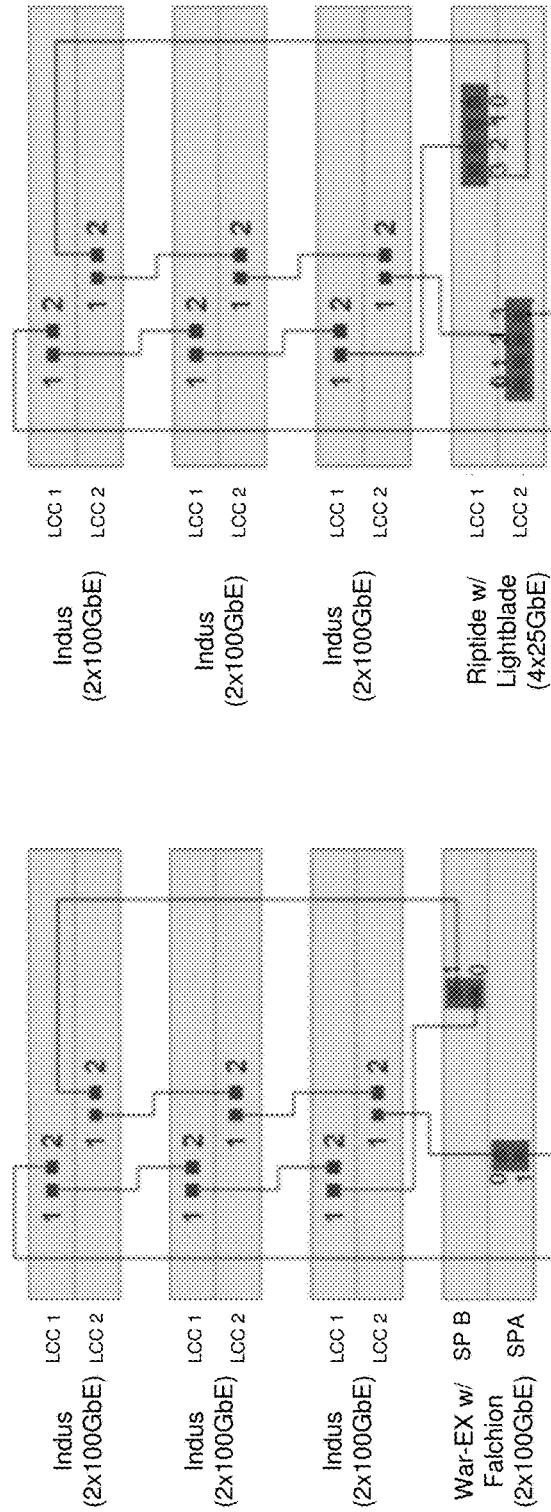
FIG. 5 is an example diagrammatic view of a system architecture according to one or more example implementations of the disclosure.

Some storage systems may be composed of storage nodes that generally consist of CPUs, Memories and a DAE (Disk Array Enclosure) as the backend. The system may support capacity expansion by connection a Smart NVMe over Fabric (NVMeOF) expansion DAE. That is, the system may also support the connection of multiple DAEs to the same nodes by chaining them, which allow further capacity expansion. Such a system architecture 400 is shown in the example implementation of FIG. 4 and architecture 500 of FIG. 5 chaining multiple enclosures. The Smart DAE may be connected to the storage Nodes through an Ethernet interface and may expose the drives and may include memory and compute resources. The storage system may use a fixed-size page granularity, where each fixed size page may be compressed disparately and stored on parity protected stripes.

Figure 6:
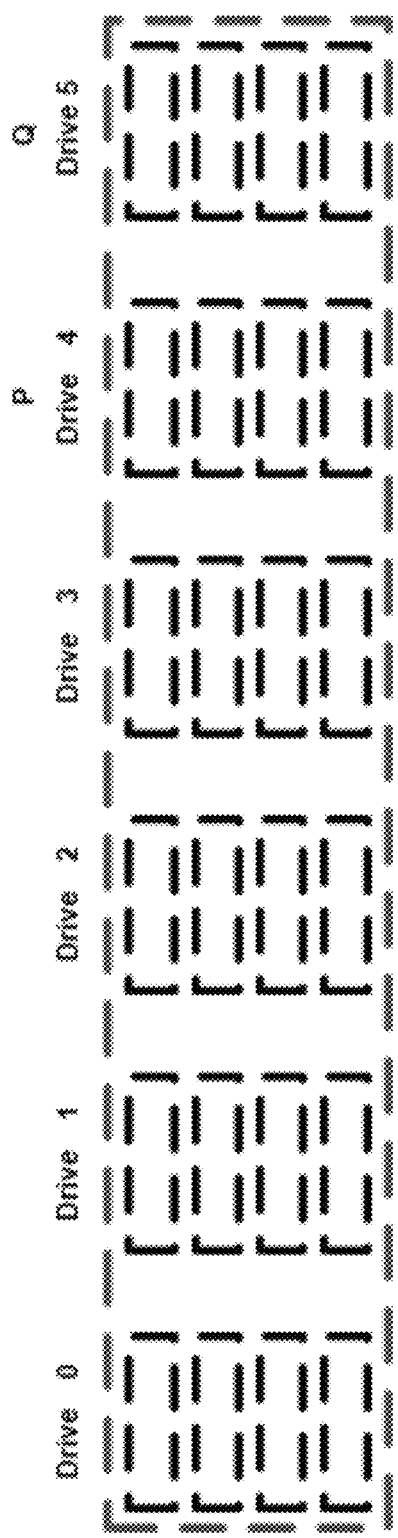
FIG. 6 is an example diagrammatic view of a system architecture of a storage container according to one or more example implementations of the disclosure.

The storage system may use a RAID 5 or RAID 6 parity protection scheme to store the user data and some of the system metadata. The RAID may be organized in grids of fixed size blocks (e.g., 4 KB), with N rows and K+1 (RAID 5) or K+2 (RAID 6) columns called UBERs. Each column may be a separate physical drive, and one (RAID 5) or two (RAID 6) columns are designated as parity. For RAID 6 for example, each UBER may contain a subset of K+2 drives, different UBERs may have different K+2 drives. The drives may be located locally to the node, on the expansion DAE or split between them. As shown in the example implementation of FIG. 6, an example architecture of a storage container (e.g., UBER) 600 with 4+2 (K=4) drives is shown. Each line in the UBER is called a PLB (Physical Large Block) which may contain, e.g., 2 MB of compressed data. Each fixed size 4 KB block is compressed separately, so a PLB may contain more than 512 data blocks. For example, in the above diagram of FIG. 6, the 2 MB may be split between four drives 0 . . . 3, each stores 512 KB, and each parity drive stores 512 KB of parity, which means each line stores a total of 3 MB. The system may always writes full PLBs, when a data block within an existing PLB is overwritten, the new (compressed) data may be written (together with more new data) to a new (empty) PLB (the existing PLB which held the old data is never modified).

The system may use a Defrag/Garbage Collection (GC) process that is used to prepare empty PLBs for new writes. The GC may use a scanner process which goes over the PLBs in the system, chooses PLBs for the GC operation, and accordingly adds the corresponding PLB descriptors for each PLB to the "Utilization Queues" based on the PLB actual utilization (e.g., the number of valid blocks within the PLB). The GC process picks two partly utilized PLBs (e.g., some of the data on them were overwritten) that may be combined into a single PLB, writes only the valid data from each of them to a new (empty) PLB. This operation results with a new empty PLB available for new writes.

Using some compression techniques, when the ingest write bandwidth is high (or the log is full) the compression level may need to be reduced or even eliminated. This means that some of the pages were not compressed in an optimal way. Furthermore, such a compression level may be currently limited at level 4 deflate (where software/other hardware implementations are capable at level 9 or above). In addition, current approaches to improve the compression level in the background have a bandwidth limitation, as the node may need to read the data over the fabric, decompress, compress and write it back over the fabric. Therefore, the system is using a suboptimal compression algorithm.

Figure 7:
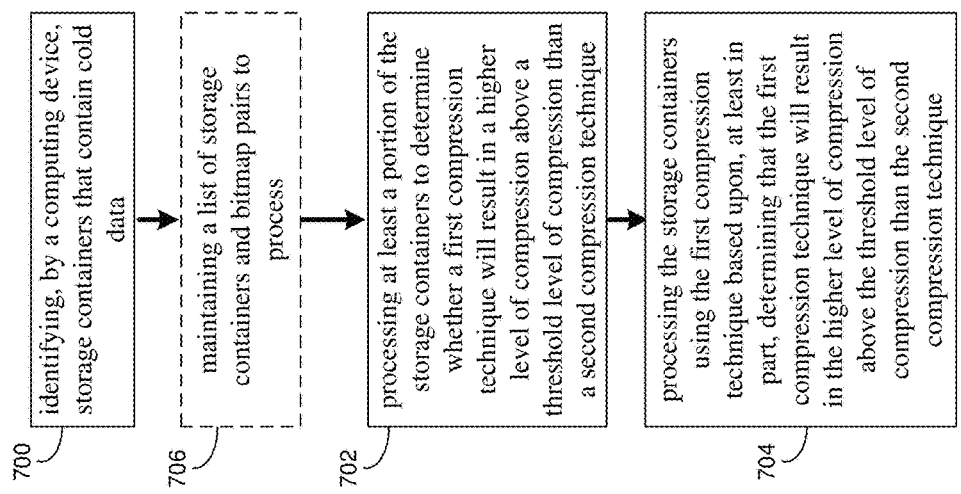
FIG. 7 is an example flowchart of a GC process according to one or more example implementations of the disclosure.

The GC Process:

As discussed above and referring also at least to the example implementations of FIG. 7, Garbage Collection (GC) process 10 may identify 700, by a computing device, storage containers that contain cold data. GC process 10 may process 702 at least a portion of the storage containers to determine whether a first compression technique will result in a higher level of compression above a threshold level of compression than a second compression technique. GC process 10 may process 704 the storage containers using the first compression technique based upon, at least in part, determining that the first compression technique will result in the higher level of compression above the threshold level of compression than the second compression technique.

In some implementations, GC process 10 may identify 700, by a computing device, storage containers that contain cold data. For example, a new scanner of GC process 10 may scan to identify storage containers (e.g., UBERs) that contain highly utilized PLBs with cold data. As described above, the GC uses a scanner process which scans the UBERs and selects candidate PLBs. However, the new scanner of GC process 10 may be added that will run in parallel to the existing one. The additional scanner will look for and identify 700 UBERs with full or almost full PLBs, that store cold data (data which was written and was not updated for more than a threshold amount of time). The new scanner of GC process 10 may communicate with the Smart DAE to feed an offload process on the smart DAE which will look for PLBs that may be well compressed with a higher compression level, discussed further below.

In some implementations, GC process 10 may maintain 706 a list of storage containers and bitmap pairs to process. For example, the Smart DAE (e.g., via GC process 10) may maintain 706 a list of UBERs+bitmap pairs to process. The new scanner of GC process 10 may periodically send commands to the Smart DAE to add more UBERs to that list, each with a bitmap specifying the cold PLBs to inspect. The scanner of GC process 10 may also provide the Uber structure, including which drives are used as parity drives.

In some implementations, GC process 10 may process 702 at least a portion of the storage containers to determine whether a first compression technique will result in a higher level of compression above a threshold level of compression than a second compression technique. For example, the Smart DAE (e.g., via GC process 10) may run a background process that will pull UBERs from the above-noted list and process 702 them, such that GC process 10 may go over the PLBs, decompress and compress each page with the higher compression level. The Smart DAE (e.g., via GC process 10) may identify the location of the compressed pages within the PLB by looking for the compression header. In some implementations, at least a second portion of the storage containers already compressed with the first compression technique may be skipped. For example, the PLBs which were already compressed with the higher compression level will be identified (e.g., by inspecting the compression header) and skipped.

In some implementations, the Smart DAE (e.g., via GC process 10) may periodically reply to the new selector with PLBs that the higher compression level provided a data reduction improvement above a specified threshold (e.g., a 10% further reduction in compression level using the higher technique verses the lower compression level technique). The desired threshold may be provided when the offload process starts in a start command.

In some implementations, GC process 10 may process 704 the storage containers using the first compression technique based upon, at least in part, determining that the first compression technique will result in the higher level of compression above the threshold level of compression than the second compression technique. For example, the new selector (e.g., via GC process 10) may process the results of the identified candidate PLBs with the high potential of data reduction using the higher compression level, and choose PLBs to be added to the Utilization Queues for GC processing 704.

In some implementations, a command may be received for each portion of the storage containers to be processed, and in some implementations, the command may include a location of a physical large block of the storage container, the first compression technique to be used, a location to write a new physical large block with the first compression technique. For example, the scanner (e.g., via GC process 10) may send a command for each of the chosen PLBs (or a single command aggregating multiple PLBs) to the Smart DAE to perform (e.g., via GC process 10) higher level compression, providing the following information (1) the location of the PLB, as well as the offset of each compressed data block within the PLB, (2) the requested compression level (e.g., the higher compression level), and (3) the location to write the new PLB with the higher compression level.

In some implementations, the Smart DAE (e.g., via GC process 10) may process the command as follows: (1) GC process 10 may read and decompress each of the data blocks within the given PLB, (2) compress each of the data block with the requested compression level, write the results to the given destination, and keep the size/offset of each of the data blocks within the new PLB, and (3) reply to the node for completion, providing the location of each of the data blocks within the new PLB.

In some implementations, the new scanner (e.g., via GC process 10) may prepare a new PLB descriptor that indicates the location of the new PLB, and add it to one or more Utilization Queues. In some implementations, metadata on a virtual logical block associated with the location may be updated, and in some implementations, the metadata that is updated may include the location of each data block within the physical large block. For example, after combining two PLBs from the Utilization Queues, GC process 10 may update the metadata on the VLB (Virtual Logical Block) that specifies the location of each of the data blocks within the PLB, using the information provided by the smart DAE (e.g., via GC process 10). In some implementations, the compression in the smart DAE may be done by, the SoC CPU or using a compression offload engine.

As such, the present disclosure, may use the available compute resources on the Smart DAE to offload a background process that looks for PLBs that may give a high data reduction using a higher compression level. This mechanism may reduce the read/write BW over the fabric, QAT utilization, and may enable higher compression levels without consuming host CPU cycles for deep compression. GC process 10 may thus improve the overall system data reduction ratio, without causing much (or any) performance degradation.

The terminology used herein is for the purpose of describing particular implementations only and is not intended to be limiting of the disclosure. As used herein, the singular forms "a", "an" and "the" are intended to include the plural forms as well, unless the context clearly indicates otherwise. As used herein, the language "at least one of A, B, and C" (and the like) should be interpreted as covering only A, only B, only C, or any combination of the three, unless the context clearly indicates otherwise. It will be further understood that the terms "comprises" and/or "comprising," when used in this specification, specify the presence of stated features, integers, steps (not necessarily in a particular order), operations, elements, and/or components, but do not preclude the presence or addition of one or more other features, integers, steps (not necessarily in a particular order), operations, elements, components, and/or groups thereof.

The corresponding structures, materials, acts, and equivalents (e.g., of all means or step plus function elements) that may be in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications, variations, substitutions, and any combinations thereof will be apparent to those of ordinary skill in the art without departing from the scope and spirit of the disclosure. The implementation(s) were chosen and described in order to explain the principles of the disclosure and the practical application, and to enable others of ordinary skill in the art to understand the disclosure for various implementation(s) with various modifications and/or any combinations of implementation(s) as are suited to the particular use contemplated.

Having thus described the disclosure of the present application in detail and by reference to implementation(s) thereof, it will be apparent that modifications, variations, and any combinations of implementation(s) (including any modifications, variations, substitutions, and combinations thereof) are possible without departing from the scope of the disclosure defined in the appended claims.

What is claimed is:

1. A computer-implemented method comprising:
   initiating, via a storage node, a garbage collection scanning process on a plurality of storage containers within a disk array enclosure coupled to the storage node;
   offloading the garbage collection scanning process from the storage node to a processor of the disk array enclosure;
   identifying, via the processor of the disk array enclosure, storage containers that contain a plurality of highly utilized physical blocks with cold data, wherein the plurality of highly utilized physical blocks include a plurality of physical blocks full with cold data;
   determining, via the processor of the disk array enclosure, whether a first compression technique will result in a higher level of compression above a threshold level of compression than a second compression technique by processing at least a portion of the storage containers; and
   processing, via the processor of the disk array enclosure, the storage containers by decompressing and compressing each page of at least one of the plurality of highly utilized physical blocks with cold data of the storage containers using only the first compression technique for a high data reduction based upon, at least in part, determining that the first compression technique will result in the higher level of compression above the threshold level of compression than the second compression technique.

2. The computer-implemented method of claim 1 further comprising maintaining a list of storage containers and bitmap pairs to process.

3. The computer-implemented method of claim 1 wherein at least a second portion of the storage containers already compressed with the first compression technique are skipped.

4. The computer-implemented method of claim 1 wherein a command is received for each portion of the storage containers to be processed.

5. The computer-implemented method of claim 4 wherein the command includes a location of the at least one of the plurality of highly utilized physical blocks with cold data of the storage container, the first compression technique to be used, a location to write a new physical block with the first compression technique.

6. The computer-implemented method of claim 5 wherein metadata on a virtual logical block associated with the location of the at least one of the plurality of highly utilized physical blocks with cold data is updated.

7. The computer-implemented method of claim 6 wherein the metadata that is updated includes the location of each data block within the at least one of the plurality of highly utilized physical blocks with cold data.

8. A computer program product residing on a non-transitory computer readable storage medium having a plurality of instructions stored thereon which, when executed across one or more processors, causes at least a portion of the one or more processors to perform operations comprising:
   initiating a garbage collection scanning process on a plurality of storage containers within a disk array enclosure coupled to the storage node;
   offloading the garbage collection scanning process from the storage node to a processor of the disk array enclosure;
   identifying storage containers that contain a plurality of highly utilized physical blocks with cold data, wherein the plurality of highly utilized physical blocks include a plurality of physical blocks full with cold data;
   determining whether a first compression technique will result in a higher level of compression above a threshold level of compression than a second compression technique by processing at least a portion of the storage containers; and
   processing the storage containers by decompressing and compressing each page of at least one of the plurality of highly utilized physical blocks with cold data of the storage containers using only the first compression technique for a high data reduction based upon, at least in part, determining that the first compression technique will result in the higher level of compression above the threshold level of compression than the second compression technique.

9. The computer program product of claim 8 wherein the operations further comprise maintaining a list of storage containers and bitmap pairs to process.

10. The computer program product of claim 8 wherein at least a second portion of the storage containers already compressed with the first compression technique are skipped.

11. The computer program product of claim 8 wherein a command is received for each portion of the storage containers to be processed.

12. The computer program product of claim 11 wherein the command includes a location of the at least one of the plurality of highly utilized physical blocks with cold data of the storage container, the first compression technique to be used, a location to write a new physical block with the first compression technique.

13. The computer program product of claim 12 wherein metadata on a virtual logical block associated with the location of the at least one of the plurality of highly utilized physical blocks with cold data is updated.

14. The computer program product of claim 13 wherein the metadata that is updated includes the location of each data block within the at least one of the plurality of highly utilized physical blocks with cold data.

15. A computing system including one or more processors and one or more memories configured to perform operations comprising:
   initiating a garbage collection scanning process on a plurality of storage containers within a disk array enclosure coupled to the storage node;
   offloading the garbage collection scanning process from the storage node to a processor of the disk array enclosure;
   identifying storage containers that contain a plurality of highly utilized physical blocks with cold data, wherein the plurality of highly utilized physical blocks include a plurality of physical blocks full with cold data;
   determining whether a first compression technique will result in a higher level of compression above a threshold level of compression than a second compression technique by processing at least a portion of the storage containers; and
   processing the storage containers by decompressing and compressing each page of at least one of the plurality of highly utilized physical blocks with cold data of the storage containers using only the first compression technique for a high data reduction based upon, at least in part, determining that the first compression technique will result in the higher level of compression above the threshold level of compression than the second compression technique.

16. The computing system of claim 15 wherein the operations further comprise maintaining a list of storage containers and bitmap pairs to process.

17. The computing system of claim 15 wherein at least a second portion of the storage containers already compressed with the first compression technique are skipped.

18. The computing system of claim 15 wherein a command is received for each portion of the storage containers to be processed.

19. The computing system of claim 18 wherein the command includes a location of the at least one of the plurality of highly utilized physical blocks with cold data of the storage container, the first compression technique to be used, a location to write a new physical block with the first compression technique.

20. The computing system of claim 19 wherein metadata on a virtual logical block associated with the location of the at least one of the plurality of highly utilized physical blocks with cold data is updated.

* * * * *